(12) United States Patent
Zhao (10) Patent No.: US 12,431,398 B2
(45) Date of Patent: Sep. 30, 2025

(54) INTERCONNECTION ARRAY DEVICE WITH SUPPORT

(71) Applicant: Avago Technologies International Sales Pte. Limited, Singapore (SG)

(72) Inventor: Sam Zhao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 433 days.

(21) Appl. No.: 17/579,252

(22) Filed: Jan. 19, 2022

(65) Prior Publication Data
US 2023/0230889 A1   Jul. 20, 2023

(51) Int. Cl.
*H01L 23/16*   (2006.01)
*H01L 21/48*   (2006.01)
*H01L 23/367*  (2006.01)
*H01L 23/498*  (2006.01)

(52) U.S. Cl.
CPC .......... *H01L 23/16* (2013.01); *H01L 21/4853* (2013.01); *H01L 23/3675* (2013.01); *H01L 23/49816* (2013.01)

(58) Field of Classification Search
CPC .......... H01L 24/12–17; H01L 21/4853; H01L 23/49816; H01L 23/49811; H01L 24/81; H01L 23/49838
See application file for complete search history.

(56) References Cited

U.S. PATENT DOCUMENTS

| | | | |
|---|---|---|---|
| 2021/0082798 A1 | 3/2021 | Lu et al. | |
| 2021/0202358 A1* | 7/2021 | Tsao | H01L 21/6835 |
| 2023/0154834 A1* | 5/2023 | Li | H01L 23/647 |
| | | | 257/738 |

FOREIGN PATENT DOCUMENTS

| | | |
|---|---|---|
| JP | H10-084011 A | 3/1998 |
| JP | H11-214585 A | 6/1999 |
| JP | 2007-324418 A | 12/2007 |

OTHER PUBLICATIONS

German Office Action of DE Appln No. 10203100394.1 dated Jan. 31, 2025.

* cited by examiner

*Primary Examiner* — Evan G Clinton
(74) *Attorney, Agent, or Firm* — Foley & Lardner LLP (57) ABSTRACT

It is described a interconnect array device (e.g., Ball Grid Array (BGA) device) comprising (a) a substrate having a substrate body and a main surface; (b) an array of solder connection elements formed at the main surface; and (c) a support structure formed at the main surface. The support structure is configured for maintaining, during a soldering process, a predefined spacing between the main surface of the substrate and a further main surface of a component carrier onto which the Ball Grid Array is mounted. The support structure comprises at least one support element. Further described is an electronic package with such a Ball Grid Array device and a method for manufacturing an electronic assembly comprising such an electronic package mounted on a component carrier.

20 Claims, 2 Drawing Sheets

INTERCONNECTION ARRAY DEVICE WITH SUPPORT

TECHNICAL FIELD

The present disclosure generally relates to the field of electronic assemblies, wherein a packaged electronic component is mounted to a component carrier. The present disclosure also relates to an electronic assembly with an electronic component packaged in an interconnect array package (e.g., a ball grid array (BGA) package, which is mounted to a component carrier.

ART BACKGROUND

Electronic packages or chip carriers are used for integrated circuits (ICs) or chips such as microprocessors, memories, analog devices, etc. to mount them on a component carrier, e.g. a Printed Circuit Board (PCB). A BGA generally includes ball shaped electric interconnection elements or contacts, which are arranged in a two-dimensional array at a bottom surface of the package. The whole bottom surface of the device can be used, instead of just the perimeter of the bottom surface. Ball shaped interconnection elements are often shortly denominated as "balls".

Due to small distances between neighboring interconnection elements, electric bridging with can result in a short circuit between neighboring balls. Such a short circuiting may be caused or at least promoted by an unwanted warpage of the package in particular within a reflow oven, wherein an assembly comprising the package and a component carrier is heated up above a certain solder reflow temperature.

SUMMARY

According to a first aspect there is provided an interconnection array device including (a) a substrate having a substrate body and a main surface; (b) an array of solder connection elements formed at the main surface; and (c) a support structure formed at the main surface. The support structure is configured for maintaining, during a soldering process, a predefined spacing between the main surface of the substrate and a further main surface of a component carrier onto which the interconnection array device is mounted. The support structure includes at least one support element. The support structure is non-collapsible during expected use and processes, resists warpage, or is rigid with respect to compressive forces in some embodiments.

In some embodiments, a Ball Grid Array (BGA) device uses a support structure, which (i) is placed between a BGA substrate and a component carrier and which (ii) is made from a material which structurally withstands solder melt temperatures, and prevents an unwanted collapse of at least one solder connection element during a (reflow) soldering process with which the BGA device is permanently mounted to a component carrier with appropriate electric contacts. The mounting process can be a surface mount process, with which the d ball grid array is placed onto the upper (further) main surface of the component carrier in some embodiments. The BGA device may be at least a part of a Surface Mount Device (SMD), i.e. a packaged electronic component being configured for being surface mounted. The surface mounting may be carried out for instance with placement machines of any type (e.g., pick and place placement machines).

In some embodiments, the solder connection elements are solder balls. However, other geometries deviating from a ball shape may be used for realizing the solder connection element(s). Other possible geometries may include ellipsoid, conical, cylindrical, cuboid geometries or combinations thereof.

With the interconnect device the process reliability of a (surface) mounting process of an electronic component may be significantly increased in an easy and effective manner in some embodiments. In some embodiments by maintaining the predefined spacing a strong compression of a solder connection element can be prevented due to a (heavy) weight of the interconnect device and optional further elements resting on the interconnect device. Hence, unwanted short circuits between neighboring solder connection elements can be effectively prevented. Further, solder connection elements may also be subjected to a high compression when such a further element, in particular a heat sink, is attached to the package with an additional pressure for instance in order to achieve a good thermal contact between the package and the further element/heat sink. For such applications the described support structure respectively the at least one support element should have a mechanical stability which withstands very high compression forces in some embodiments.

The component carrier can be a mounting support structure which is capable of accommodating one or more components thereon and/or therein for providing mechanical support and/or electrical connectivity. In other words, a component carrier can be configured as a mechanical and/or electronic carrier for electronic (BGA) components. In particular, a component carrier can be one of a Printed Circuit Board (PCB), an interposer, and an IC (integrated circuit) substrate. A component carrier may also be a hybrid board combining different ones of the above mentioned types of component carriers.

The described support structure does not collapse during a surface mount solder reflow process of a BGA package on e.g. a PCB so that the molten solder connection elements, e.g. solder balls, are not further compressed at temperatures above the melting point of the solder connection elements in some embodiments. The support structure may be so stable that there will be no collapse even under comparatively strong compression forces which might result from a comparatively high weight e.g. from a heat sink attachment of the BGA package in some embodiments.

A reflow process is realized within a reflow oven which heats its interior with appropriately controlled heating elements. Reflow temperatures may be higher than 183° C. and in particular higher than 220° C. in some embodiments. In some applications, the reflow temperature may be higher than 245° C. and in particular higher than 300° C.

According to some embodiments, the support structure includes a number of support elements, which are spatially separated from each other. This use of support elements reduces the area which is to be occupied by the support structure such that for most applications there is still available a sufficiently high number of (ball shaped) solder connection elements for contacting an electronic circuitry comprising at least one component, which is mounted at the substrate on a surface opposite to the main surface. The number of support elements, e.g. two, three, four, five or even more, allows the solder connection elements to be spatially distributed at the main surface in such a manner that there is a stable mechanical support. In some embodiments, the support elements can be distributed such that even with a not perfectly uniform reflow solder process, wherein some solder connection elements become melted earlier than other solder connection elements, the main surface of the substrate body stays oriented parallel with the further main surface of the component carrier. For each support element, an appropriate height is chosen based upon system parameters and design criteria. In some embodiments, all support elements have at least approximately the same height.

According to some embodiments, at least some of the support elements are located at least approximately at one diagonal line (of two diagonal lines) connecting opposite corners of the substrate body. This may allow to predefine appropriate positions for the support elements in an easy manner. Further, when forming the support elements at the main surface of the substrate the support elements can be placed in a precise and easily reproducible manner at the predefined positions.

It is pointed out that diagonal lines are not only given for a square shaped substrate body. Diagonal lines may also be given for other shapes such as a rectangle, a parallelogram, a rhomb etc. For such shapes two diagonal lines have a crossing point at the geometric center of the substrate body. However, in other embodiments also substrate bodies having a more asymmetric shape and/or having more than four corners can be used. In such embodiments there may be given more than two diagonal lines and/or at least one center point, wherein the at least one center point may be located at or out of the geometric center of the substrate body.

According to some embodiments, the support element is a central support element which is located (at least approximately) in the center of the main surface of the substrate. This may provide the advantage in particular for BGA devices with a concave warpage, e.g. caused during a (hot) reflow process because of a mismatch of the Coefficient of Thermal Expansion (CTE) between different materials of the BGA device and in particular of a BGA package comprising the described BGA device, wherein, after mounting the BGA device, the center of the substrate (body) is closest to the further main surface of the component carrier.

For substrates having a main surface which is rectangular or even quadratic in shape, the center respectively a center position of the main surface may be defined by the intersection of two diagonal lines connecting opposite corners of the substrate body. In some embodiments, other geometries the center may be defined in other ways. In any way, the central support element may be placed at a position which, after mounting, is closest to the main surface of a component carrier.

In some embodiments with a central support element also at least one other "off center" support element may be used for providing an additional compression prevention in at least one other region of the substrate body. At least one other support element may be used for preventing an unwanted tilting of the BGA device/BGA package with respect to the component carrier.

In some embodiments, at least one of the support elements is a corner support element, which is located (at least approximately) at a corner of the main surface of the substrate. This may be of benefit in particular for BGA devices with a convex warpage or a complex warpage, wherein in the mounted state the respective edge exhibits the closest distance to the further main surface of the component carrier.

Advantageously, three or four corner support elements can be provided for stable support. In some embodiments, at least one of the support elements is an edge support element, which is located (at least approximately) along an edge of the main surface of the substrate. The described at least one edge support element may also be of advantage for a BGA device which exhibits a convex shape. In other words, the support element(s) is/are placed along the substrate edges which may be desireable in some examples when the risk of a short circuiting between different solder connection elements is higher for outer rows due to higher compression forces acting on the solder connection elements during reflow soldering.

In some embodiments there are provided at least two edge support elements which are located at opposite edges. In other embodiments there are provided at least four edge support elements wherein at least two are located at two opposite edges and wherein at least two other edge support elements are located at two other opposite edges of the substrate. Since the edges of the substrate are generally geometrically defined in a precise manner the edge support element(s) can be easily placed, in a reproduceable manner, for a batch of BGA devices, at suitable positions/locations at the main surface.

According to a further embodiment the array of solder connection elements forms a regular pattern of array node positions and at least one support element is formed at an array node position.

In case of several support elements each occupying an array node position each one of the several support elements is in some embodiments located at its own array node position. This means that one array node position can only be occupied by a single support element. In some embodiments, a single support element could occupy more than one array node positions when the size (diameter, for example) is larger than the solder ball diameter.

In some embodiments, at least one of the solder connection elements is replaced by one support element. Hence, when manufacturing the described BGA device, the formation of the support elements of the support structure can be accomplished simultaneously or at least temporally close to a usual formation of the solder connection elements at the main surface of the substrate. Due to the thermally stable structure of the support elements, the support elements are formed prior to the formation of the solder connection elements. A "solder connection element replacement" may be used to realize the described BGA device in an easy and effective manner.

According to a further embodiment the at least one support element is formed at an array node position is an electrically conductive support element. This may provide the advantage that not only the (not replaced) solder connection elements but also the at least one electrically conductive support element may provide a contribution to a high and/or to a highly flexible connectivity between then described BGA array and external circuitry formed at or within the component carrier.

According to a further embodiment the array of solder connection elements forms a regular pattern of array node positions and at least one support element is formed between two neighboring array node positions.

In this configuration the support structure may be formed without losing an electric connection because there is no "solder connection element replacement". Hence, the connectivity of the Ball Grid Array device with external circuitry, which may be provided in particular at or within the component carrier, will be not be hampered in some embodiments.

In some embodiments, the inter solder connection element or inter ball support the respective support element(s) is small (e.g., narrow enough) in order not to disturb a reflow soldering process. In some embodiments, if the at least one support element is made from or includes an electrically insulating material such that even when solder material of a solder connection element reaches the respective support element there is no or less risk of short-circuiting neighboring solder connection elements due to a support element.

According to a further embodiment at least one support element of the number of support elements includes (a) a base portion adjoining the substrate; (b) a tip portion facing away from the substrate; and (c) a middle portion formed between the base portion and the tip portion. The base portion and the tip portion are made from or include a solderable material. Further, the middle portion is made from or includes an electrically conductive material which stays solid at reflow temperatures.

The solderable material of the two end portions, i.e. the base portion and the tip portion, may allow for electrically connecting permanently the BGA device with external circuitry at or within the component carrier not only via the solder connection elements but also via the respective at least one support element by means of one and the same (reflow) soldering process. Hence, a high electric conductivity can be realized in an efficient manner.

According to a further embodiment at least one support element from the plurality of support elements further comprises an insulating jacket surrounding (at least partially) a sidewall of the middle portion.

The described insulating jacket may allow to electrically insulate the per se conductive support element from neighboring (also conductive) solder connection elements. Hence, unwanted short circuits between at least one of such a neighboring (also conductive) solder connection element and the respective conductive support element can be effectively prevented.

It is pointed out that the provision of the insulating jacket may be in particular of advantage if, during a (reflow) soldering process a neighboring compressed solder connection element changes its shape towards a round bodied or bulgy shape. With the described insulating jacket the widened region of such a bulgy shaped solder connection element, which in the absence of such an insulating jacket, would have the highest probability to cause or make at least a contribution to a short circuit. Hence, the described insulating jacket effectively prevents unwanted short circuiting.

According to a further embodiment at least one support element from the plurality of support elements is made (only) from an electrically insulating material. This may provide the advantage that even with a simple structural design of the respective solder connection element unwanted short circuits between (neighboring) solder connection elements can be effectively prevented.

The electrically insulating material has a sufficient mechanical stability even at high (reflow) soldering temperatures in order to provide the desired anti-collapse support effect for the solderable solder connection elements in some embodiments. The electrically insulating material is a high temperature plastic or Teflon in some embodiments.

According to a further embodiment the electrically insulating material of the at least one support element from the plurality of support elements is attached to the main surface of the substrate by means of an adhesive. This may allow to attach the respective support element in an easy and effective manner to the substrate.

According to a further embodiment at least one support element from the plurality of support elements is or comprises an electronic component. This may provide the advantage that the described supporting effect can be combined with the possibility to provide electronic functionality also in a spatial region between the substrate of the BGA device and the component carrier.

In order to comply with the usual height of a BGA solder connection element the described electronic component should be very small and in particular very flat. Such a requirement can be fulfilled easily with a passive electronic component having typically only two electric terminals. In this respect a passive component is a component which does not have a source of energy and/or which is not able to amplify an electric signal and/or to control any other circuitry. Examples for passive components are diodes, resistors, inductors, and capacitors.

According to a further embodiment the electronic component is a capacitor.

Combining the described support function of the support structure with a capacitive function, which capacitively couples two solder connection elements with each other, may allow to improve the signal integrity already at a position close to the substrate of the described BGA device. Specifically, when, as will be described below in more detail, an electronic/semiconductor component is mounted at the substrate at another main surface (opposite) to the main surface of the substrate, an electric (signal) path between the mounted component and the capacitor can be kept very short. This may hold true in particular when the supporting capacitor is mounted at the substrate opposite to the location of the mounted component.

According to a further aspect of the described technology there is provided an electronic package comprising (a) a Ball Grid Array device according to any aspect or embodiment described above; and (b) a semiconductor chip, which is mounted at another main surface of the substrate and which is electrically connected with at least two of the solder connection elements, wherein the another main surface is opposite to the main surface.

Also the described electronic package is based on the idea that with the above described support structure of the BGA device an unwanted (gravity caused) collapse or strong compression of at least one solder connection element during a (reflow) soldering process, with which the BGA electronic package is permanently and with appropriate electric contacts mounted to a component carrier, can be effectively prevented.

In some embodiments, the semiconductor chip may be located in the center or outside from center of the substrate body. Further, an electronic package in accordance with the described technology may also include more than one semiconductor chip. Thereby, at least one of the at least two dies may be supported at its corners.

According to an embodiment the semiconductor chip spatially occupies a mounting area of the another main surface of the substrate, which mounting area form only a part of the another main surface. Further, the support structure comprises four support elements, wherein each one of the four support elements is formed at one inner corner position of the main surface of the substrate, wherein, with respect to the substrate body, the inner corner position is opposite to one corner of the mounting area.

Placing the support elements close to respectively one corner of the mounting area respectively to one corner of the mounted semiconductor chip may provide two advantages in some embodiments. A first advantage may be that the location of the support elements is precisely defined which may facilitate the support structure formation process. A second advantage is based on simulations carried out by the inventor which surprisingly revealed that, at least for typical dimensions of the substrate and the semiconductor chip (parallel to the plane of the main surface), the inner corner positions allow for a good support function irrespectively whether the Ball Grid Array device respectively the larger entity electronic package exhibits a convex, a concave, or a more complex warpage. Hence, without having an a priori knowledge about a possible (unwanted) warpage the described inner corner position are suitable substrate positions in order to allow for a reliable (reflow) soldering process resulting in a correct and reliable electrical connection.

According to a further embodiment at least one of the four support elements is or includes a capacitor.

Interconnecting at least one capacitor close to the body of the semiconductor chip within an electric contacting structure of the chip may allow to achieve a high signal integrity already very close to the semiconductor chip. This high signal integrity may be the result of the matter of fact that there may be no long signal paths to and/or from the semiconductor chip which are not "capacitively protected" such that they could be disturbed e.g. by sudden surge of power supply voltage.

In some embodiments, the electronic package further comprises a heat spreader being formed at the another main surface of the substrate, wherein the heat spreader covers at least the semiconductor chip. The described heat spreader may provide heat dissipation from the semiconductor chip as well as protect the semiconductor chip from the environment such that the semiconductor chip can operate in a reliable manner. Further, the heat spreader may improve the mechanical stability of the entire electronic package.

According to a further aspect there is provided a method for manufacturing an electronic assembly. The provided method comprises (a) producing an electronic package as described above; (b) mounting the Ball Grid Array device of the electronic package at a further main surface of a component carrier such that at least some of the solder connection elements are in contact with a respective connection pad at the further main surface of a component carrier; (c) heating up at least the Ball Grid Array device such that the solder of the solder connection elements becomes liquid (and connect to connection pads of the component carrier); and (d) cooling down at least the Ball Grid Array device such that the liquid solder of the solder connection elements becomes solid.

Also the described manufacturing method is based on the idea that with the provision of the support structure of the BGA device an unwanted (gravity induced) too strong compression of at least one solder connection element during a (reflow) soldering process can be effectively prevented.

According to an embodiment producing an electronic package comprises (a) forming the support structure at the main surface; and (b) forming the solder connection elements at the main surface.

As has already been mentioned briefly above, in some embodiments the support structure is formed prior to the formation of the solder connection elements. This may provide the advantage that the support structure and in particular the plurality of support elements, which must stay stable even at typical solder reflow temperatures, can be formed at temperatures which are (significantly) higher than a typical reflow temperature. This may allow to produce/form a support structure having an extraordinarily high thermal stability. Since in this particular embodiment the solder connection elements are formed after the formation of the support structure they can be formed with known and well approved ball formation processes at a suitable temperature.

At this point it is mentioned that in other embodiments the solder connection elements are formed prior to the formation of the support structure. In other embodiments the solder connection elements are formed together with the support structure.

It has to be noted that embodiments have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present technology are apparent from the examples of embodiment to be described hereinafter and are explained with reference to the examples of embodiment. The invention will be described in more detail hereinafter with reference to some embodiments but to which the invention is not limited.

BRIEF DESCRIPTION OF THE DRAWING

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

The illustration in the drawing is schematic. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to another element(s) as illustrated in the Figures. Thus, the spatially relative terms may apply to orientations in use which differ from the orientation depicted in the Figures. Obviously all such spatially relative terms refer to the orientation shown in the Figures only for ease of description and are not necessarily limiting as an apparatus according to an embodiment of the invention can assume orientations different than those illustrated in the Figures when in use.

The systems and methods described herein can be used reduce the possibility "bad" electric contacts(e.g., a short circuit between neighboring ball shaped interconnection elements or a missing electric contact between at least one ball shaped interconnection contact and the corresponding contact pad at the component carrier) due to small distances between neighboring ball shaped interconnection elements. In some embodiments, the systems and methods can be used with large body size BGA packages, which have an area of e.g. 55 mm×55 mm or even larger and can be particularly prone to an electric bridging with solder material resulting in a short circuit between neighboring balls. In some embodiments, the systems and methods can be used to reduce an unwanted warpage of the BGA package in particular within a reflow oven, wherein an assembly comprising the BGA package and a component carrier is heated up above a certain solder reflow temperature.

In some embodiments, the systems and methods can be used to reduce warpage due to the corners or edges of the package being raised compared to the central region during reflow soldering which causes balls in the center of the BGA package exhibit the largest deformation and/or balls at the corners or edges are not contacted properly. In some embodiments, the systems and methods can be used to reduce warpage due to the central region being elevated resulting in open connection for center balls and/or high deformation induced short circuits between ball contacts at the corners or edges of the package. In some embodiments, the systems and methods can be used to reduce a risk of producing a short circuit between neighboring solder balls due to highly compressed balls.

In some embodiments, the systems and methods can be used to avoid ball bridging between the neighboring solder balls in their liquid state (e.g. when undergoing a reflow process) in packages with an integrated heat spreader. The molten solder balls must be able to support the entire weight of the package without collapsing together integrated heat spreader which adds to the weight of the package significantly. In some embodiments, the systems and methods are advantageously used with flip chip BGA packages with copper heat spreader structures having a thickness of, for example, 1 mm or thicker. To avoid ball bridging between the neighboring solder balls in their liquid state, e.g. when undergoing a reflow process, the systems and methods assist molten solder balls supporting the entire weight of the package without collapsing together in some embodiments. In some embodiments, the systems and methods are used with BGA packages which have an external heat sink is to be attached for heat dissipation. The systems and methods are used to reduce problems associated with the a high compression force for the heat sink attachment and the time-dependent solder ball deformation phenomenon known as solder creep.

Figure 1A:
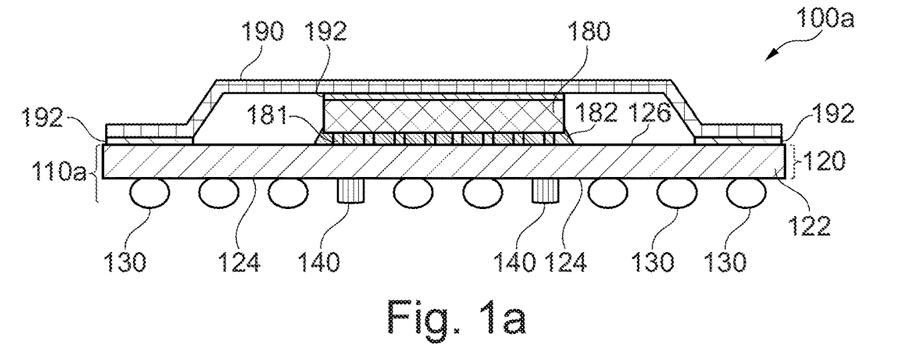
FIG. 1a shows an electronic package with a semiconductor chip, wherein according to a first embodiment support elements are located below the corners of the semiconductor chip.

FIG. 1a shows an electronic package 100a according to a first embodiment. The electronic package 100a comprises an interconnect array device (e.g, a Ball Grid Array (BGA) device 110a) and a semiconductor chip 180. The BGA device 110a comprises a substrate 120 and a number of solder connection elements 130, which are formed at the lower main surface 124 of the substrate 120. The semiconductor chip 180 is mounted to another main surface 126 of the substrate 120, which in FIG. 1a is an upper surface and which is opposite to the main surface 124.

According to the embodiment described here the solder connection elements are solder balls 130. Depending on the specific application the substrate 120 may be any suitable support (basis) for the semiconductor chip 180, which support allows to electrically connect, in a non-depicted manner, chip connections 181 of the semiconductor chip 180 with, respectively, at least one solder connection element 130. Thereby, the substrate 120 may comprise, embedded within a substrate body 122, an electric circuitry which forms a so-called redistribution structure. The electric circuitry may comprise, parallel to the main surface 124, (horizontal) conductor paths and, perpendicular to the main surface 124, (vertical) via connections. The redistribution structure may allow to spatially spread the solder connection elements 130 with regard to the chip connections 181. The substrate 120 may be made of or may comprise for instance a Printed Circuit Board (PCB), in particular a multilayer PCB made from either organic or ceramic materials.

As can be taken from FIG. 1a, the electronic package 100a further comprises a heat spreader 190 which helps heat dissipation from the semiconductor chip 180 as well as providing from environmental protections for the semiconductor chip 180. The heat spreader 190 may be made of or may comprise any suitable thermally conductive material, such as copper, alloys thereof or other metals. According to the embodiment described here, the heat spreader 190 is mechanically connected both to (the upper surface 126 of) the substrate 120 and to the upper surface of the semiconductor chip 180 by means of an adhesive material 192. Also, the adhesive material 192 is made of or comprises a suitable and thermally conductive material in some embodiments. Further, the semiconductor chip 180 is mechanically connected with the substrate 120 using an underfill material 182.

In accordance with one aspect of the technology described in this document, the BGA device 110a does not only include, formed at the main surface 124, the ball shaped solder connection elements 130. In order to avoid, during a (reflow) soldering process for permanently mounting and electrically connecting the electronic package 100a at a further main surface of a not depicted component carrier, e.g. a PCB, an unwanted excessive compression of the then liquid solder connection elements 130, there are formed a plurality of support elements 140 at the main surface 124 of the substrate 120.

According to the embodiment described here the electronic package 100a comprises four support elements 140, which are located in the regions just below the corners of the semiconductor chip 180. In the cross-sectional view of FIG. 1a, only two of these "inner corner" support elements 140 can be seen.

As can be taken from FIG. 1a, the support elements 140 are located at the grid position instead of a solder connection element 130. This means that when manufacturing the BGA device 110a four solder connection elements have to be replaced by respectively one support element 140. However, it is mentioned that in other embodiments at least one support element 140 is positioned in between two neighboring solder connection elements 130.

The support elements 140 have a height, which is smaller than the diameter of the ball shaped solder connection elements 130. Hence, during a reflow soldering process the solder connection elements 130 may be compressed, due to a pressure caused e.g. by weight of the electronic package 110b, only down to a height corresponding to the height of the solder connection elements 130. When selecting a proper height of the support elements 140 it should be considered that during the soldering process (i) on the one hand the compression should be sufficiently strong such that a reliable electric connection is formed and (ii) on the other hand the compression is not so strong such that a solder connection element 130 collapses completely. Such a complete collapse may produce e.g. a short circuit caused by a ball bridging.

As has already been mentioned above, the (lateral) position of the support elements 140 at least approximately at the corners of the semiconductor chip 180 may allow for an effective and appropriate support function for many different warpage characteristics of BGA package. Specifically, irrespectively whether the BGA device 110a exhibits a convex or concave warpage, e.g. caused during the soldering process because of a CTE mismatch within the electronic package 100a, there may always be given a proper support.

Figure 1B:
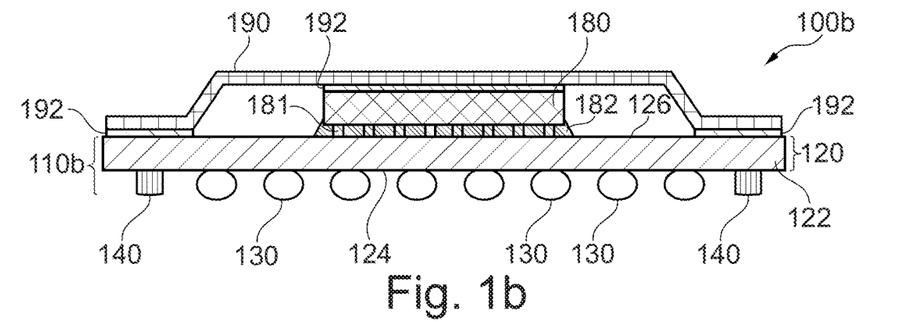
FIG. 1B shows an electronic package with a substrate, wherein according to a second embodiment support elements are located below the corners of the substrate.

FIG. 1B shows an electronic package 100b with a BGA device 110b according to another embodiment of the described technology. The electronic package 100b substantially corresponds to the electronic package 100a shown in FIG. 1a. The only difference is that at the lower main surface 124 of the substrate 120 of the BGA device 110b the four support elements 140 are located at the four corners of the substrate 120. Again, due to the cross-sectional view of FIG. 1B only two of the four "outer corner" support elements 140 are depicted.

Figure 1C:
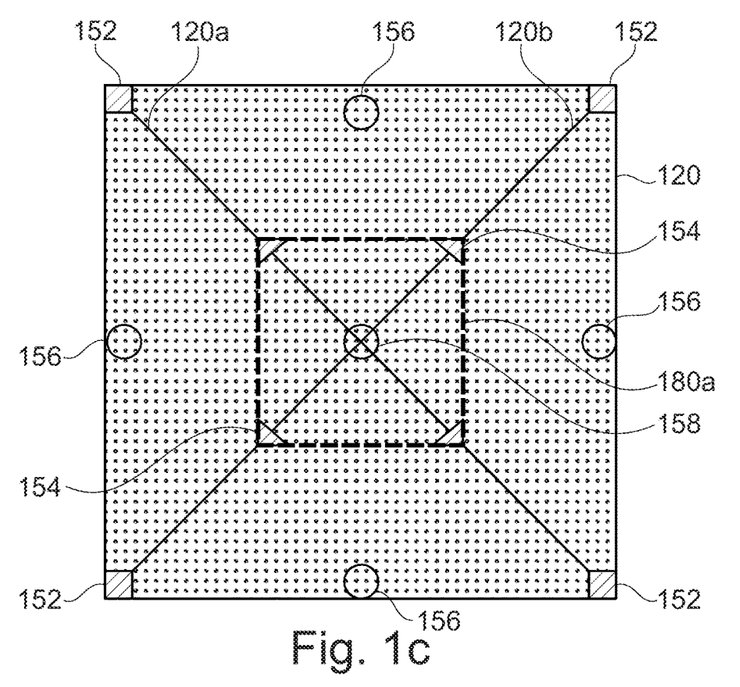
FIG. 1c shows in a top view possible locations for support elements formed at the substrate of an electronic package.

FIG. 1c shows in a top view of regions for support elements at the lower main surface of the substrate 120 of an electronic package in accordance with the described technology.

In many applications cases regions for support elements are located along two diagonal lines connecting opposite corners of the substrate 120. In FIG. 1c, a first diagonal line is denominated with reference numeral 120a and the second diagonal line is denominated with reference numeral 120b. Along these diagonal lines 120a, 120b there may are located (a) four inner corner regions 154, which are used for the support elements 140 of the BGA device 110a, and four outer corner regions 152, which are used for the support elements 140 of the BGA device 110b. In order to visualize the location of the four inner corner regions 154 an outline 180a of the semiconductor chip 180 is sketched in FIG. 1c. Support elements 140 can have a square, rectangular, hexagonal, pentagonal, oval or circulator cross sectional area.

It is pointed out that in BGA packages where the semiconductor chip 180 is off-centered on the substrate 120, the four inner corner regions 154 follow the corners of the semiconductor chip 180 and may not locate at or near the substrate diagonal lines 120a and 120b.

Further possible regions for locating (additional) support elements are edge regions 156 located close to respectively one edge of the substrate 120 and a central region 158 in the (geometric) center of the substrate 120. The edge regions 156 may be located in the middle between two adjacent corners of the substrate 120. In case there is more than one edge region between two adjacent corners the respective two or more edge regions may be distributed evenly along the respective edge.

Figure 2A:
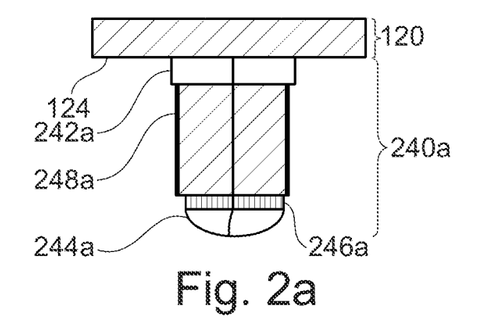
FIG. 2a shows an electrically conductive support element with an insulating jacket.

FIG. 2a shows an electrically conductive support element 240a. The support element 240a comprises a base portion 242a. The base portion 242a comprises a solderable material which allows the support element 240a to be electrically connected to a not depicted conductor pad at the bottom main surface 124 of the substrate 120.

The support element 240a further comprises a conductive middle portion 246a. The middle portion 246a is made from or comprises a material which is mechanically stable at typical reflow temperatures. Hence, during a reflow soldering process the middle portion 246a provides substantially the entire support function.

Further, the support element 240a comprises a tip portion 244a, which also comprises a solderable material. This allows the electrically conductive support element 240a to be electrically connected to a not depicted conductor pad of an also not depicted component carrier onto which the respective electronic package is permanently mounted in the reflow soldering process. Descriptively speaking, the electrically conductive and geometrically stable middle portion 246a is "sandwiched" between the two solderable portions 242a and 244a.

As can be taken from FIG. 2a, the conductive support element 240a further comprises a jacket 248a made from an electrically insulating material. The insulating material may be a high temperature stable plastic such as teflon. The insulating jacket 248a, which surrounds the outer sidewall of the middle portion 246a, allows to electrically insulate the conductive middle portion 246a from neighboring (also conductive) solder connection elements. Hence, unwanted short circuits between at least one of such a neighboring (also conductive) solder connection element and the respective conductive support element can be effectively prevented.

Figure 2B:
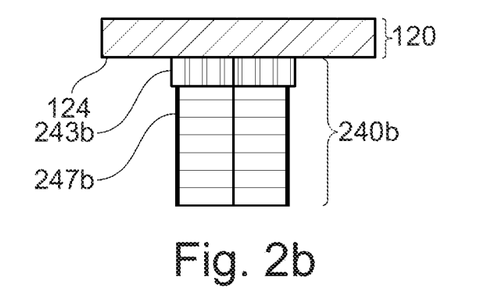
FIG. 2b shows an electrically insulating support element.

FIG. 2b shows an electrically insulating support element 240b. Due to its electric insulation property the support element 240b cannot contribute to electric connections between a semiconductor chip and a component carrier onto which the respective electronic package is mounted. As an advantage, the support element 240b does not provide any risk for any short circuit between two solder connection elements.

As can be taken from FIG. 2b, the electrically insulating support element 240b comprises an insulating portion 247b, which is made from or at least comprises a material being mechanically stable even at typical reflow temperatures. Again high temperature stable plastic or teflon may be used as such a material. During a reflow soldering process the insulating portion 247b provides substantially the entire support function.

According to the embodiment described here the support element 240b respectively the insulating portion 247b is attached to the bottom main surface 124 of the substrate 120 by means of an appropriate adhesive 243b. In some embodiments, the adhesive 243b is also stable at solder reflow temperatures.

Figure 3:
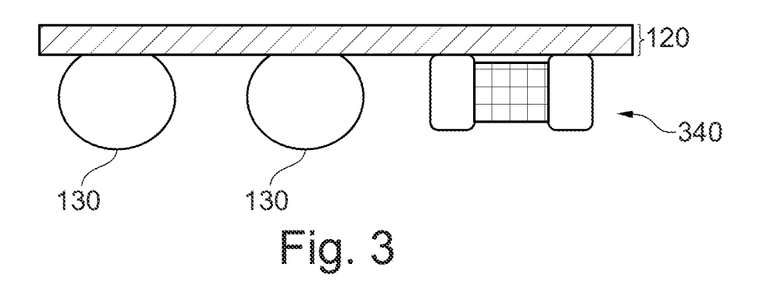
FIG. 3 shows a detail of a BGA device with a capacitor acting as a support element.

FIG. 3 shows a detail of a BGA device with a capacitor 340 acting as a support element. The capacitor 340 should have a dimension and/or should be oriented such that there is again a support height which is smaller than the height of the ball shaped solder connection elements 130.

As has already been mentioned above, using a capacitor electrically connected in an appropriate manner as a support element, the capacitor can provide two functions. A first function is the support function according to the main aspect of the described technology. The second function is to prevent power supply electrical noise from entering the system. This may ensure a high quality of power supply to the semiconductor chip in some embodiments.

Figure 4:
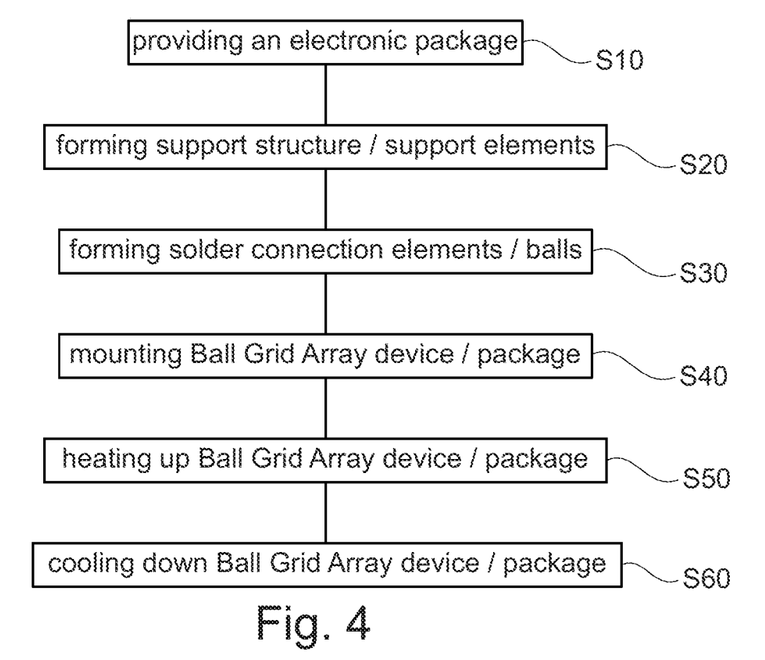
FIG. 4 shows a flowchart of a method for manufacturing an electronic assembly in accordance with an embodiment.

FIG. 4 shows a flowchart of a method for manufacturing an electronic assembly in accordance with an embodiment.

According to the embodiment described here the method is described with six main operations. It should be understood by the skilled person that in a more fine view the manufacturing method may be described with more operations compared to the main operations described here. Appropriate additional operations may be carried out before, in between, and/or after the described main operations.

In a first operation S10, there is provided an electronic package which is a precursor of e.g. the BGA electronic packages 100a or 100b. Specifically, compared to the electronic packages 100a/100b, the provided electronic package does not yet comprise the ball shaped solder connection elements 130 and the support elements 140.

In a second operation S20, a support structure with an appropriate number and appropriate type of support elements is formed at the lower main surface of the substrate of the respective BGA device. This formation can take place at temperatures which may be, at least for a certain time window, higher than a typical reflow soldering temperature. Hence, very stable support elements can be produced.

In a third operation S30, ball shaped solder connection elements are formed (around the support elements) also at the lower main surface of the substrate. Usual solder ball formation processes can be used.

In a fourth operation S40, the BGA device respectively the larger entity electronic package is mounted to a component carrier. For this mounting process a usual Surface Mount Device (SMD) placement machine can be used.

In a fifth operation S50 a reflow soldering process is carried out. For this process the BGA device respectively the larger entity electronic package is heated up to a temperature which is above the melting point of the solder material used for the solder connection elements. This process can be carried out in a known reflow oven device.

As has been described above in detail, the support elements prevent the ball shaped solder connection elements to collapse.

In a fifth operation S60 the reflow soldering process is stopped by lowering the temperature of the BGA device/the electronic package. The temperature decrease can be realized by cooling down the mentioned oven. However, in some embodiments, the temperature decrease is realized simply by moving/transporting the BGA device/the electronic package out from the reflow oven.

It should be noted that the term "comprising" does not exclude other elements or operations and the use of articles "a" or "an" does not exclude a plurality. Also elements described in association with different embodiments may be combined. It should also be noted that reference signs in the claims should not be construed as limiting the scope of the claims.

What is claimed is:

1. An interconnect array device comprising
a substrate having a substrate body and a main surface;
an array of solder connection elements formed at the main surface; and
a support structure formed at the main surface, wherein the support structure is configured for maintaining, during a soldering process, a spacing between the main surface of the substrate and a further main surface of a component carrier onto which the interconnect array device is mounted and the support structure comprises a plurality of support elements, each of the support elements comprising an electrically conductive material surrounded by an insulative jacket.

2. The interconnect array device as set forth claim 1, wherein the insulative jacket has an outside surface conforming to an outside surface of the electrically conductive material of a support element of the support elements.

3. The interconnect array device as set forth in claim 1, wherein at least some of the support elements are located at least approximately at one diagonal line connecting opposite corners of the substrate body.

4. The interconnect array device as set forth in claim 1, wherein a support element of the support elements is a central support element which is located at least approximately in a center of the main surface of the substrate.

5. The interconnect array device as set forth in claim 3, wherein at least one of the support elements is a corner support element, which is located at a corner of the main surface of the substrate.

6. The interconnect array device as set forth in claim 1, wherein at least one of the support elements is an edge support element, which is located along an edge of the main surface of the substrate.

7. The interconnect array device as set forth in claim 1, wherein the array of solder connection elements forms a regular pattern of array node positions and wherein at least one support element of the support elements is formed at an array node position.

8. The interconnect array device as set forth in claim 7, wherein the at least one support element is formed at the array node position is an electrically conductive support element.

9. The interconnect array device as set forth in claim 1, wherein the array of solder connection elements forms a regular pattern of array node positions and wherein at least one support element of the support elements is formed between two neighboring array node positions.

10. The interconnect array device as set forth in claim 1, wherein at least one support element from the plurality of support elements comprises
a base portion adjoining the substrate;
a tip portion facing away from the substrate; and
a middle portion formed between the base portion and the tip portion; wherein the base portion and the tip portion are made from or comprises a solderable material and wherein the middle portion is made from or comprises the electrically conductive material which stays solid at reflow temperatures.

11. The interconnect array device as set forth in claim 1, wherein at least one support element from the plurality of support elements comprises
a base portion adjoining the substrate;
a tip portion facing away from the substrate; and
a middle portion formed between the base portion and the tip portion; wherein the base portion and the tip portion are made from or comprises a solderable material and wherein the middle portion is made from or comprises the electrically conductive material which stays solid at reflow temperatures, the insulative jacket having a hollow cylindrical shape and surrounds a sidewall of the middle portion.

12. The interconnect array device as set forth in claim 10, wherein the tip portion extends beyond a bottom surface of the insulative jacket.

13. The interconnect array device as set forth in claim 1, wherein the insulative jacket has a hollow prismatic shape conforming to an outside surface of a conductive element of the support element of the support elements.

14. The interconnect array device as set forth in claim 1, wherein at least one other support element from the plurality of support elements is or comprises an electronic component.

15. The interconnect array device as set forth in claim 14, wherein the electronic component is a capacitor.

16. An electronic package comprising
a Ball Grid Array device, comprising:
   a substrate having a substrate body and a main surface;
   an array of solder connection elements formed at the main surface of the substrate; and
   a support structure formed at the main surface, wherein the support structure is configured for maintaining, during a soldering process, a spacing between the main surface of the substrate and a further main surface of a component carrier onto which the Ball Grid Array device is mounted and the support structure comprises at least one support element comprising an electrically conductive material surrounded by an insulative jacket configured as a hollow cylinder; and
a semiconductor chip disposed at another main surface of the substrate and which is electrically connected with at least two of the solder connection elements, wherein the another main surface is opposite to the main surface.

17. The electronic package as set forth in claim 16, wherein the semiconductor chip spatially occupies a mounting area of the another main surface of the substrate, wherein the mounting area forms only a part of the another main surface, and the support structure comprises four support elements, wherein each one of the four support elements is formed at one inner corner position of the main surface of the substrate, wherein the one inner corner position is opposite to one corner of the mounting area.

18. The electronic package as set forth in claim 17, wherein at least one of the four support elements is or comprises a capacitor.

19. An interconnect array device, comprising
   a substrate having a substrate body and a main surface;
   an array of solder connection elements disposed at the main surface; and
   a support structure disposed at the main surface, wherein the support structure is configured for maintaining, during a soldering process, a spacing between the main surface of the substrate and a further main surface of a component carrier, wherein the interconnect array device is configured to be mounted onto the component carrier, and the support structure comprises a plurality of support elements each comprising an electrically conductive material surrounded by an insulative jacket; and
a semiconductor chip configured to be mounted at another main surface of the substrate and configured to be electrically connected with at least two of the solder connection elements, wherein the another main surface is opposite to the main surface of the substrate.

20. The interconnect array device as set forth in claim 19, wherein the semiconductor chip spatially occupies a mounting area of the another main surface of the substrate, wherein the mounting area comprises only a part of the another main surface, and the support structure comprises four support elements, wherein each one of the four support elements is formed at one inner corner position of the main surface of the substrate.

* * * * *